(12) United States Patent
Hoss et al.

(10) Patent No.: US 7,480,147 B2
(45) Date of Patent: Jan. 20, 2009

(54) HEAT DISSIPATION APPARATUS UTILIZING EMPTY COMPONENT SLOT

(75) Inventors: Shawn P. Hoss, Round Rock, TX (US); Paul T. Artman, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 51 days.

(21) Appl. No.: 11/549,453

(22) Filed: Oct. 13, 2006

(65) Prior Publication Data

US 2008/0089034 A1    Apr. 17, 2008

(51) Int. Cl.
*H05K 7/20*   (2006.01)
*H01R 13/00*  (2006.01)

(52) U.S. Cl. .................. 361/721; 361/715; 361/716; 439/485; 439/487

(58) Field of Classification Search .............. None
See application file for complete search history.

(56) References Cited

U.S. PATENT DOCUMENTS

| | | | | |
|---|---|---|---|---|
| 3,582,865 | A * | 6/1971 | Franck et al. ............... 439/67 |
| 5,966,289 | A * | 10/1999 | Hastings et al. ............ 361/704 |
| 6,201,699 | B1 * | 3/2001 | Ayres et al. ................ 361/707 |
| 6,310,776 | B1 * | 10/2001 | Byrne et al. ............... 361/707 |
| 6,330,160 | B1 * | 12/2001 | Ayres et al. ................ 361/707 |
| 6,407,923 | B1 * | 6/2002 | Gerlock et al. ............. 361/704 |
| 6,411,511 | B1 | 6/2002 | Chen |
| 6,434,005 | B1 * | 8/2002 | Vinciarelli et al. .......... 361/704 |
| 6,535,387 | B2 | 3/2003 | Summers et al. |
| 6,765,797 | B2 * | 7/2004 | Summers et al. ........... 361/704 |
| 6,775,139 | B2 * | 8/2004 | Hsueh ....................... 361/697 |
| 6,934,152 | B1 * | 8/2005 | Barrow ...................... 361/690 |
| 7,023,700 | B2 | 4/2006 | Chiou et al. |
| 7,023,701 | B2 * | 4/2006 | Stocken et al. ............. 361/704 |
| 7,106,595 | B2 * | 9/2006 | Foster et al. ............... 361/721 |
| 7,142,428 | B2 * | 11/2006 | Vackar ...................... 361/710 |
| 7,151,669 | B2 * | 12/2006 | Liu .......................... 361/707 |
| 7,365,990 | B2 * | 4/2008 | RaghuRam ................. 361/720 |
| 2001/0019913 | A1 | 9/2001 | Llapitan et al. |
| 2006/0221573 | A1 * | 10/2006 | Li ............................ 361/704 |
| 2007/0070607 | A1 * | 3/2007 | Goodwin ................... 361/719 |
| 2007/0217160 | A1 * | 9/2007 | Legen et al. ............... 361/704 |

OTHER PUBLICATIONS

Search and Examination Report issued by the British Patent Office, Application No. GB 0719831.0, Jan. 24, 2008.

* cited by examiner

*Primary Examiner*—Boris L Chervinsky
(74) *Attorney, Agent, or Firm*—Haynes and Boone, LLP

(57) ABSTRACT

A heat dissipation apparatus includes a first commponent connector defining a first component slot immediately adjacent the first component connector, wherein the first component connector is located adjacent to and spaced apart from a second component connector that defines a second component slot. A heat dissipating member is thermally coupled to a heat producing component such that the heat dissipating member is located in the second component slot that is defined by the second component connector when the heat producing component is coupled to the first component connector and located in the first component slot. The heat dissipation apparatus may be coupled to a heat producing component and used to dissipate heat from the heat producing component when there are empty component connector slots located adjacent the component connector that the heat producing component is coupled to.

20 Claims, 9 Drawing Sheets

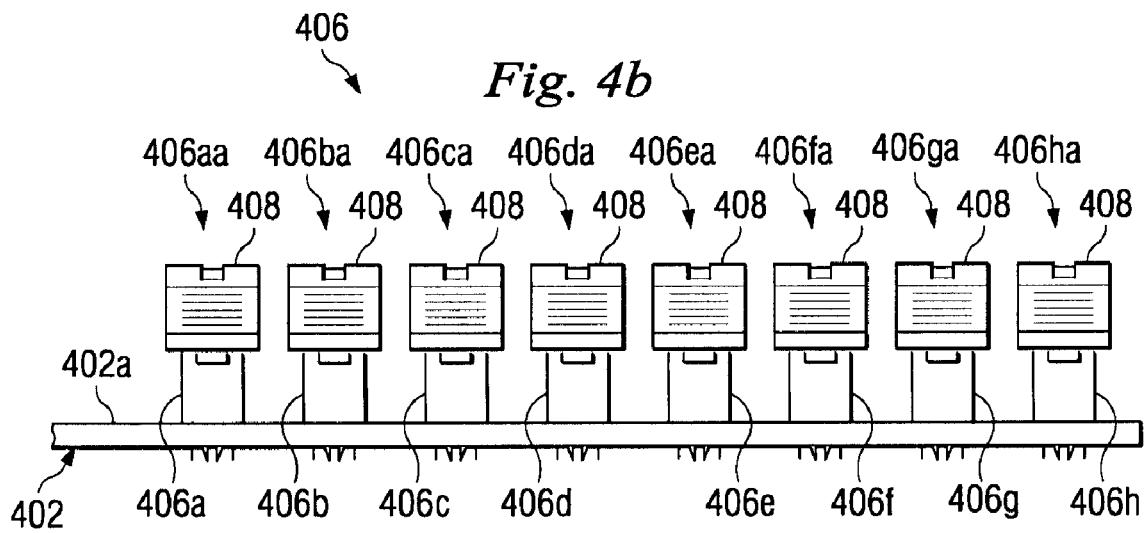
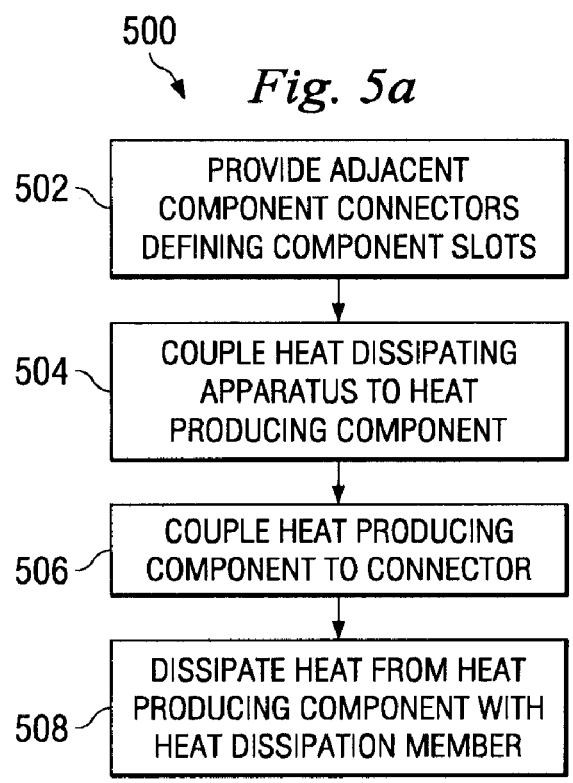

HEAT DISSIPATION APPARATUS UTILIZING EMPTY COMPONENT SLOT

BACKGROUND

The present disclosure relates generally to information handling systems, and more particularly to a heat dissipation apparatus for cooling an information handling system component that utilizes an empty information handling system component slot.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Many IHSs include a plurality of components slots that couple IHS components such as, for example, memory components, to the IHS. As the power of these components increases, the cooling of the components can raise a number of issues.

For example, it may be desirable to include Fully Buffered Dual Inline Memory Modules (FBDIMMs) coupled to some of the component slots in the IHS. Typically, the FBDIMMs will occupy less than half of the component slots available for the FBDIMMs in the IHS. However, because a fan is used to provide airflow past the FBDIMMs in order to cool the FBDIMMs, the empty component slots result in air passageways between the FBDIMMs that allow air to bypass the FBDIMMs without cooling them.

Conventional solutions include positioning blanks in the empty component slots in order to minimize airflow bypass and increase the airflow velocities adjacent the FBDIMMs in order to ensure the proper cooling of the FBDIMMs. However, as the power of FBDIMMs continues to increase, such cooling solutions may not be sufficient to allow the FBDIMMs to operate at full capacity.

Accordingly, it would be desirable to provide a heat dissipation apparatus absent the disadvantages discussed above.

SUMMARY

According to one embodiment, a heat dissipation apparatus includes first component connector defining a first component slot immediately adjacent the first component connector, wherein the first component connector is located adjacent to and spaced apart from a second component connector that defines a second component slot, and a heat dissipating member is thermally coupled to a heat producing component such that the heat dissipating member is located in the second component slot that is defined by the second component connector when the heat producing component is coupled to the first component connector and located in the first component slot.

BRIEF DESCRIPTION OF THE DRAWINGS

FIG. 4b a is a side view illustrating an embodiment of an IHS including a plurality of adjacent connectors used with the heat producing component of FIG. 2 and the heat dissipation apparatus of FIGS. 3a, 3b, 3c and 3d.

FIG. 5a is a flow chart illustrating an embodiment of a method for dissipating heat from a heat producing component.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
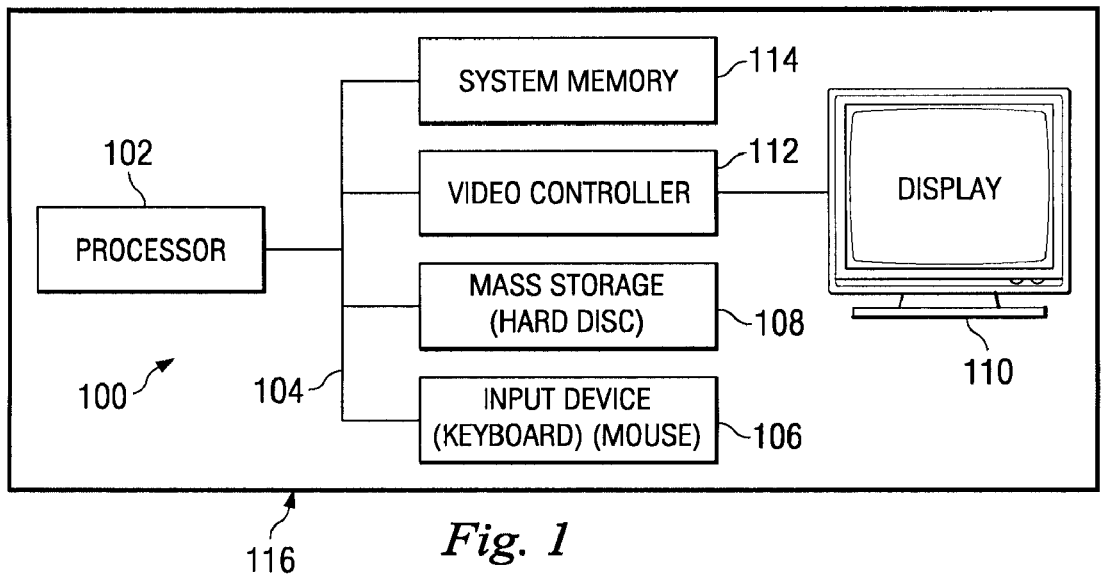
FIG. 1 is a schematic view illustrating an embodiment of an IHS.

In one embodiment, IHS 100, FIG. 1, includes a processor 102, which is connected to a bus 104. Bus 104 serves as a connection between processor 102 and other components of computer system 100. An input device 106 is coupled to processor 102 to provide input to processor 102. Examples of input devices include keyboards, touchscreens, and pointing devices such as mouses, trackballs and trackpads. Programs and data are stored on a mass storage device 108, which is coupled to processor 102. Mass storage devices include such devices as hard disks, optical disks, magneto-optical drives, floppy drives and the like. IHS 100 further includes a display 110, which is coupled to processor 102 by a video controller 112. A system memory 114 is coupled to processor 102 to provide the processor with fast storage to facilitate execution of computer programs by processor 102. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
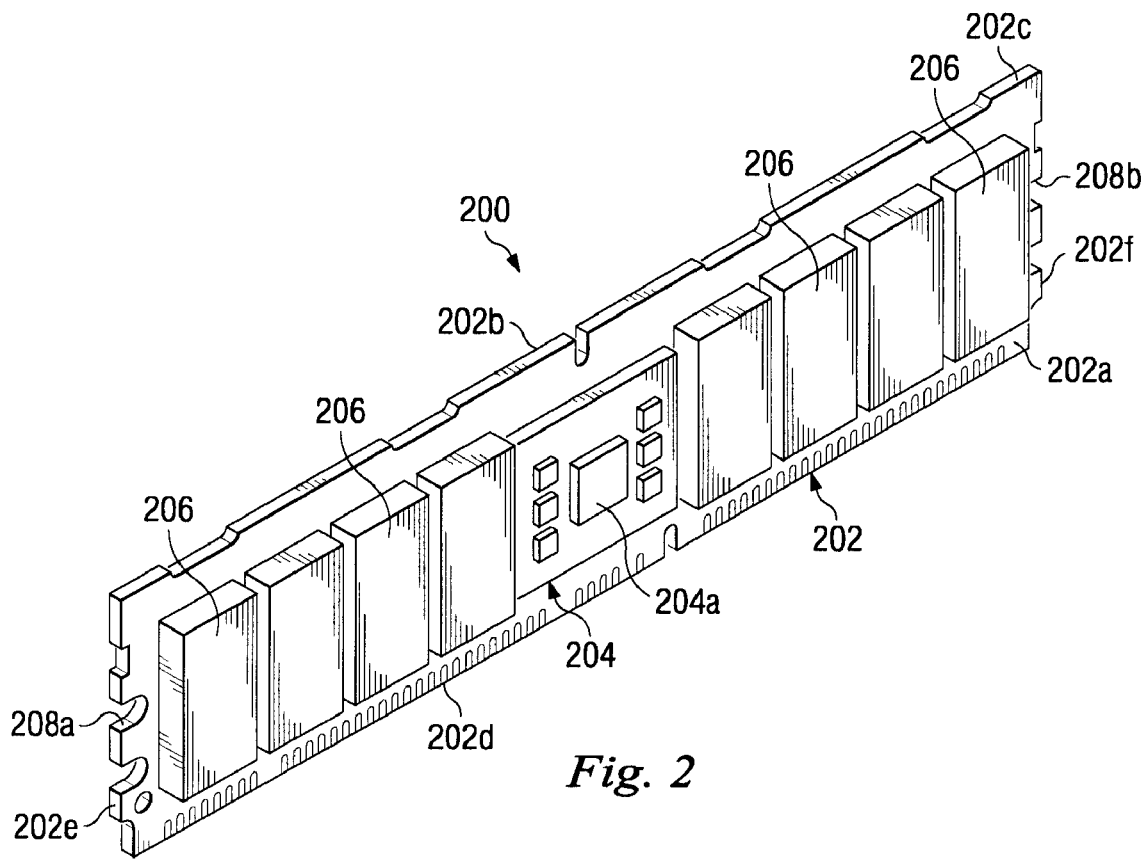
FIG. 2 is a perspective view illustrating an embodiment of a heat producing component.

Referring now to FIG. 2, a heat producing component 200 is illustrated. As illustrated, the heat producing component 200 is a memory device heat producing component such as, for example, an FBDIMM. However, the heat producing component 200 may be another type of heat producing component that is operable to couple to any of a plurality of adjacent connectors such as, for example, an expansion card, a memory device, or a variety of other heat producing components known in the art. The heat producing component 200 includes a base 202 having a front surface 202a, a rear surface 202b located opposite the front surface 202a, a top edge 202c extending between the front surface 202a and the rear surface 202b, a bottom edge 202d located opposite the top edge 202c and extending between the front surface 202a and the rear surface 202b, and a pair of opposing side edges 202e and 202f extending between the front surface 202a, the rear surface 202b, the top edge 202c, and the bottom edge 202d. A plurality of heat producing members 204 and 206 extend from the front surface 202a of the heat producing component 200. A heat transfer die 204a extends from heat producing member 204. In an embodiment, the heat producing members 204 and 206 may be, for example, processors, Dynamic Random Access Memory (DRAM), or a variety of other heat producing members known in the art. In an embodiment, a plurality of heat producing components (not shown) may extend from the rear surface 202b of the base 202. A plurality of connector coupling channels 208a and 208b are defined by the base 202 and located on the side edges 202e and 202f, respectively.

Figure 3A:
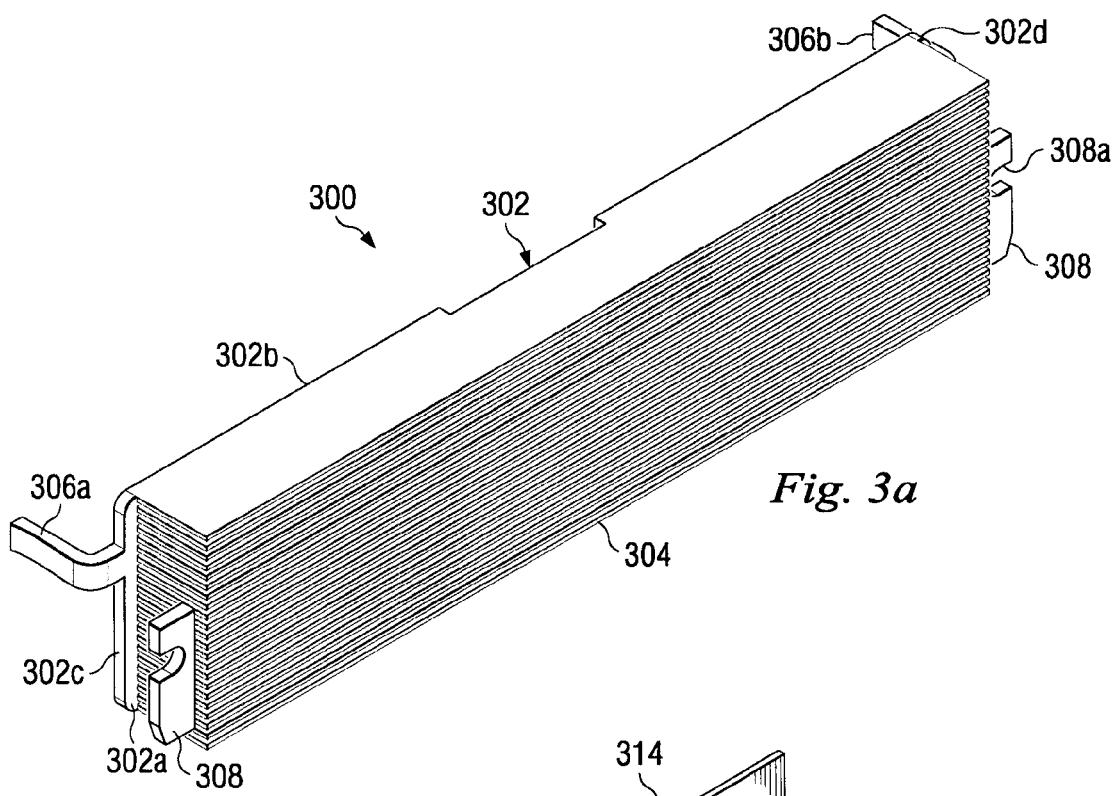
FIG. 3a is a perspective view illustrating an embodiment of a first heat dissipation member of a heat dissipation apparatus used with the heat producing component of FIG. 2.

Referring now to FIG. 3a, a heat dissipation apparatus 300 is illustrated. The heat dissipation apparatus 300 includes a first heat transfer base 302 having a front surface 302a, a rear surface 302b located opposite the front surface 302a, and a pair of opposing side edges 302c and 302d extending between the front surface 302a and the rear surface 302b. A first heat dissipating member 304 extends from the front surface 302a of the first heat transfer base 302 and along the length of the first heat transfer base 302. In an embodiment, the first heat dissipating member 304 includes a plurality of fins. A second base coupling arm 306a extends from the side edge 302c of the first heat transfer base 302 and includes a substantially 90 degree bend such that the second base coupling arm 306a extends out past the rear surface 302b of the first heat transfer base 302. A second base coupling arm 306b extends from the side edge 302d in substantially the same manner as the second base coupling arm 306a from the side edge 302c. A pair of second connector coupling members 308 extend from the first heat dissipation member 304 and adjacent the side edges 302c and 302d of the first heat transfer base 302. A connector coupling channel 308a is defined by each second connector coupling member 308.

Figure 3B:
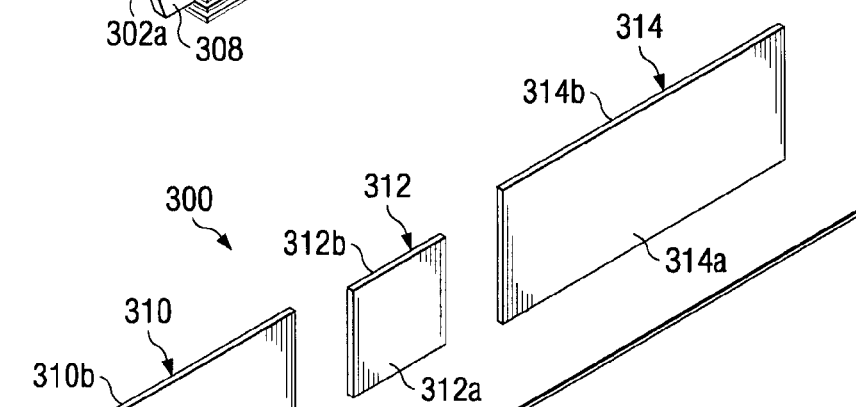
FIG. 3b is a perspective view illustrating an embodiment of a plurality of thermal interface materials of a heat dissipation apparatus used with the heat producing component of FIG. 2.
Figure 3C:
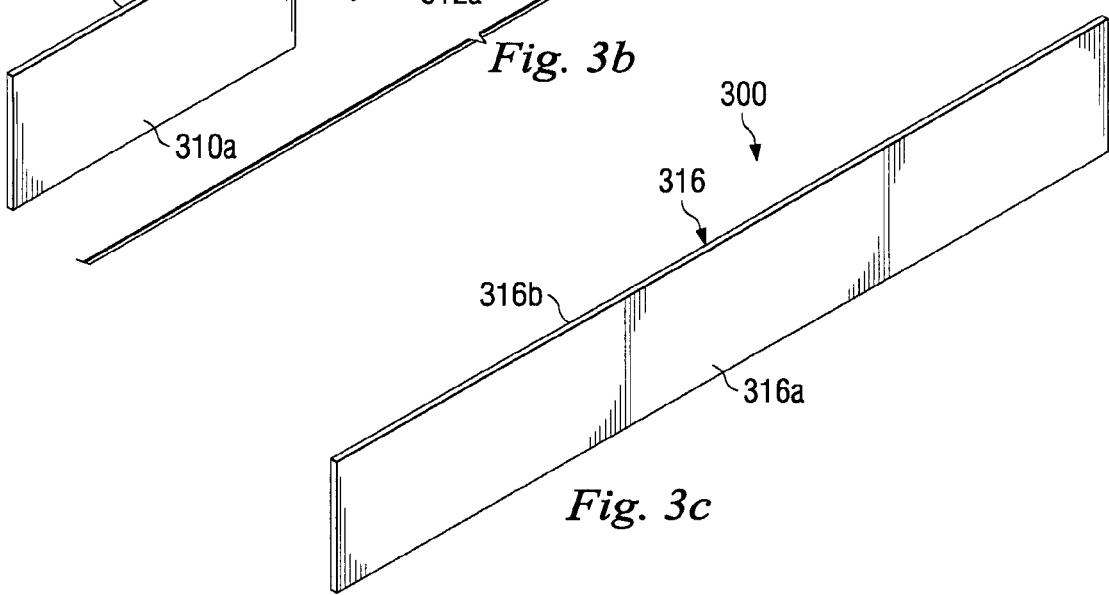
FIG. 3c is a perspective view illustrating an embodiment of a thermal interface material of a heat dissipation apparatus used with the heat producing component of FIG. 2.

Referring now to FIGS. 3b and 3c, in an embodiment, the heat dissipation apparatus 300 also includes a plurality of thermal interface materials 310, 312 and 314. In an embodiment, the thermal interface materials 310, 312 and 314 are conventional thermal interface materials known in the art. The thermal interface material 310 includes a front surface 310a and a rear surface 310b located opposite the front surface 310a. The thermal interface materials 312 includes a front surface 312a and a rear surface 312b located opposite the front surface 312a. The thermal interface materials 314 includes a front surface 314a and a rear surface 314b located opposite the front surface 314a. In an embodiment, the heat dissipation apparatus 300 also includes a thermal interface material 316 which, in an embodiment, may also be a conventional thermal interface material known in the art. The thermal interface materials 316 includes a front surface 316a and a rear surface 316b located opposite the front surface 310a.

Figure 3D:
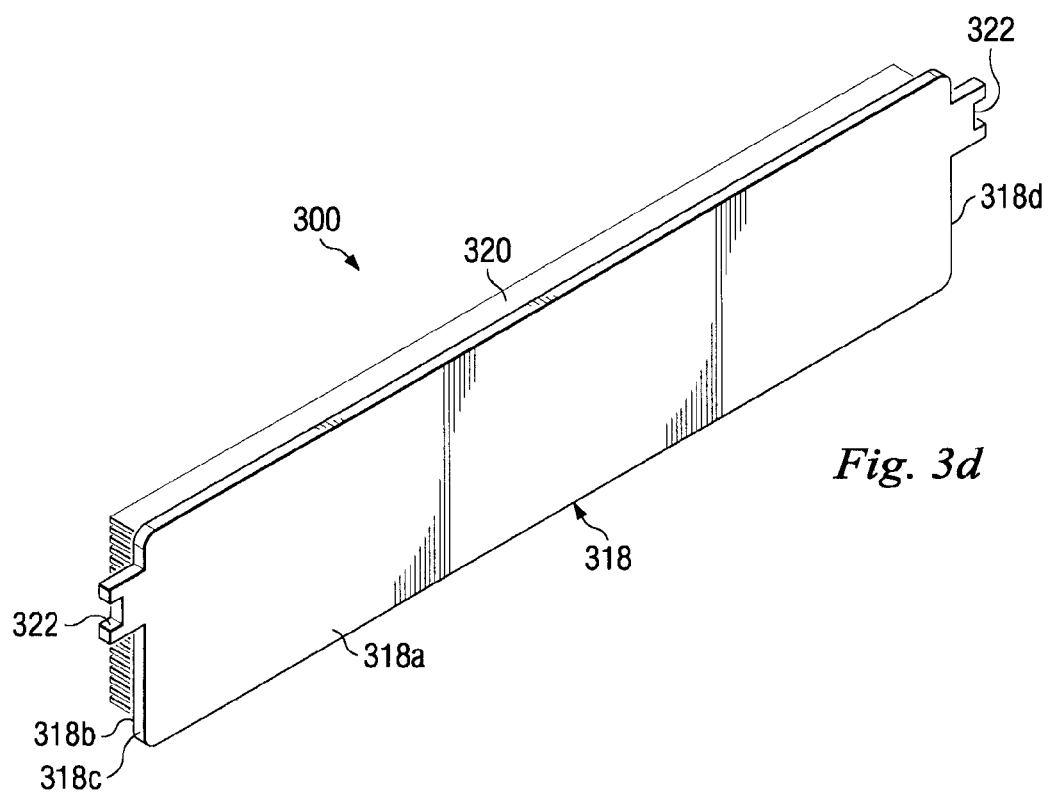
FIG. 3d is a perspective view illustrating an embodiment of a second heat transfer base of a heat dissipation apparatus used with the heat producing component of FIG. 2.

Referring now to FIG. 3d, the heat dissipation apparatus 300 also includes a second heat transfer base 318 having a front surface 318a, a rear surface 318b located opposite the front surface 318a, and a pair of opposing side edges 318c and 318d extending between the front surface 318a and the rear surface 318b. A second heat dissipating member 320 extends from the rear surface 318b of the second heat transfer base 318 and along the length of the second heat transfer base 318. In an embodiment, the second heat dissipating member 320 includes a plurality of fins. A pair of first base coupling channels 322 are defined by the second heat transfer base 318 and located adjacent the side edges 318c and 318d of the second heat transfer base 318.

Figure 4A:
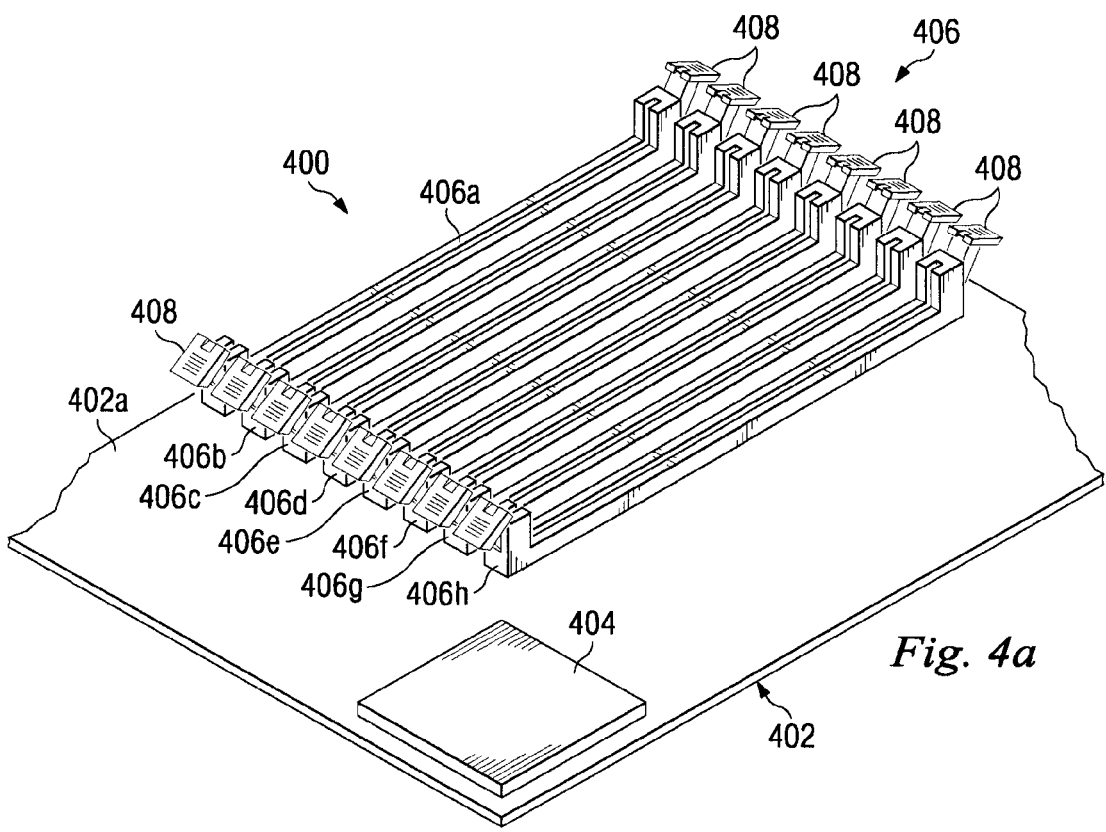
FIG. 4a a is a perspective view illustrating an embodiment of an IHS including a plurality of adjacent connectors used with the heat producing component of FIG. 2 and the heat dissipation apparatus of FIGS. 3a, 3b, 3c and 3d.

Referring now to FIGS. 4a and 4b, an IHS 400 is illustrated. The IHS 400 may be the IHS 100, described above with reference to FIG. 1. The IHS 400 includes a board 402 having a top surface 402a. The board 402 may be located in the IHS chassis 116, described above with reference to FIG. 1, and may include some or all of the components of the IHS 100, described above with reference to FIG. 1. A processor 404, which may be the processor 102, described above with reference to FIG. 1, is mounted on the top surface 402a of the board 402 and is electrically coupled to the board 402. A plurality of connectors 406 are mounted on the top surface 402a of the board 402 and are electrically coupled to the board 402 and the processor 404. The plurality of connectors 406 include spaced apart and adjacent connectors 406a, 406b, 406c, 406d, 406e, 406f, 406g and 406h. Each of the connectors 406a, 406b, 406c, 406d, 406e, 406f, 406g and 406h defines a connector slot 406aa, 406ba, 406ca, 406da, 406ea, 406fa, 406ga and 406ha, respectively, located immediately adjacent and above the connector 406a, 406b, 406c, 406d, 406e, 406f, 406g and 406h, respectively. Each connector 406a, 406b, 406c, 406d, 406e, 406f, 406g and 406h also includes a securing member 408 located on each end of the connector 406a, 406b, 406c, 406d, 406e, 406f, 406g and 406h.

Figure 5B:
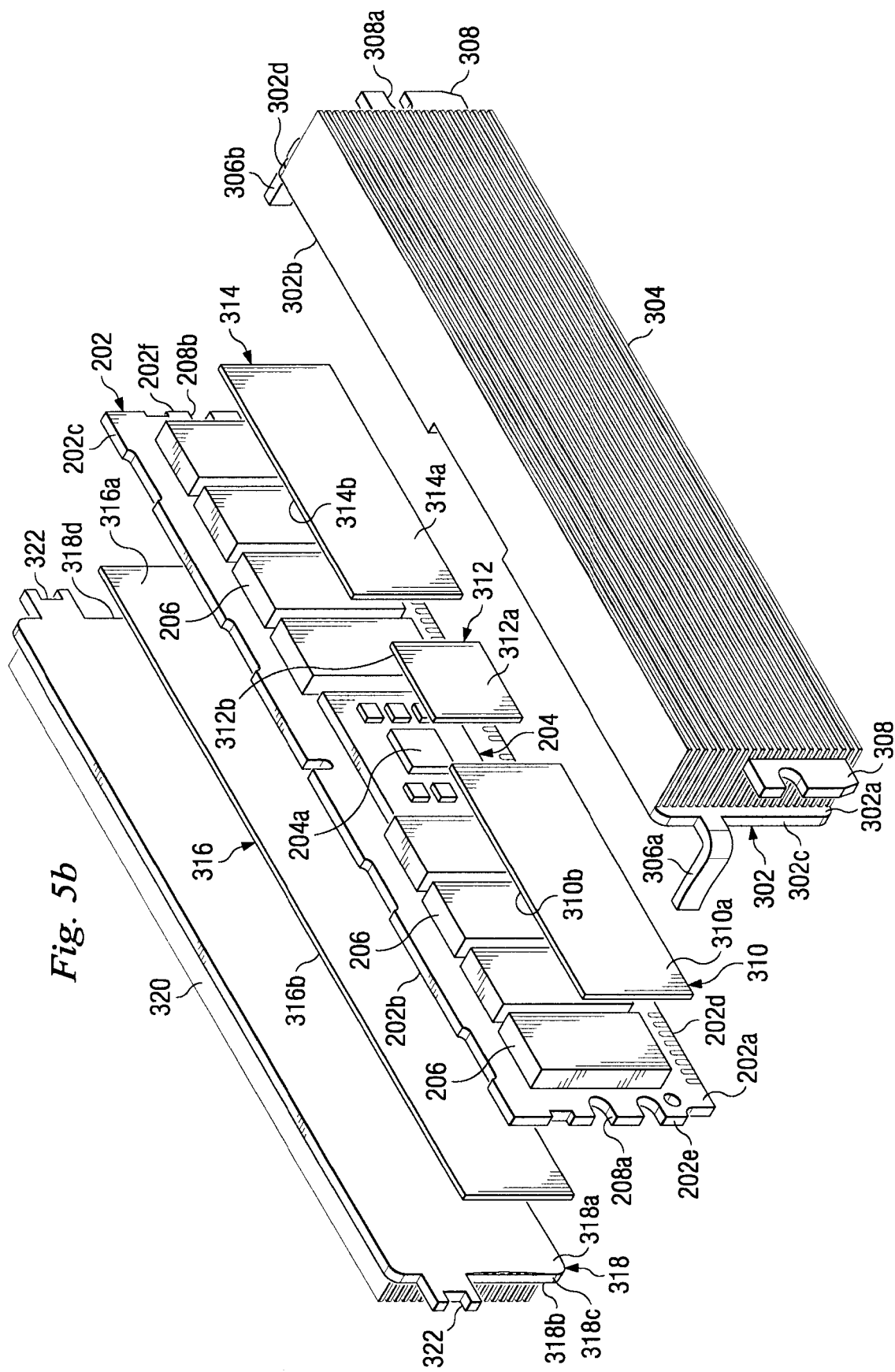
FIG. 5b is an exploded view illustrating an embodiment of the assembly of the heat producing component of FIG. 2 and the heat dissipation apparatus of FIGS. 3a, 3b, 3c and 3d.
Figure 5C:
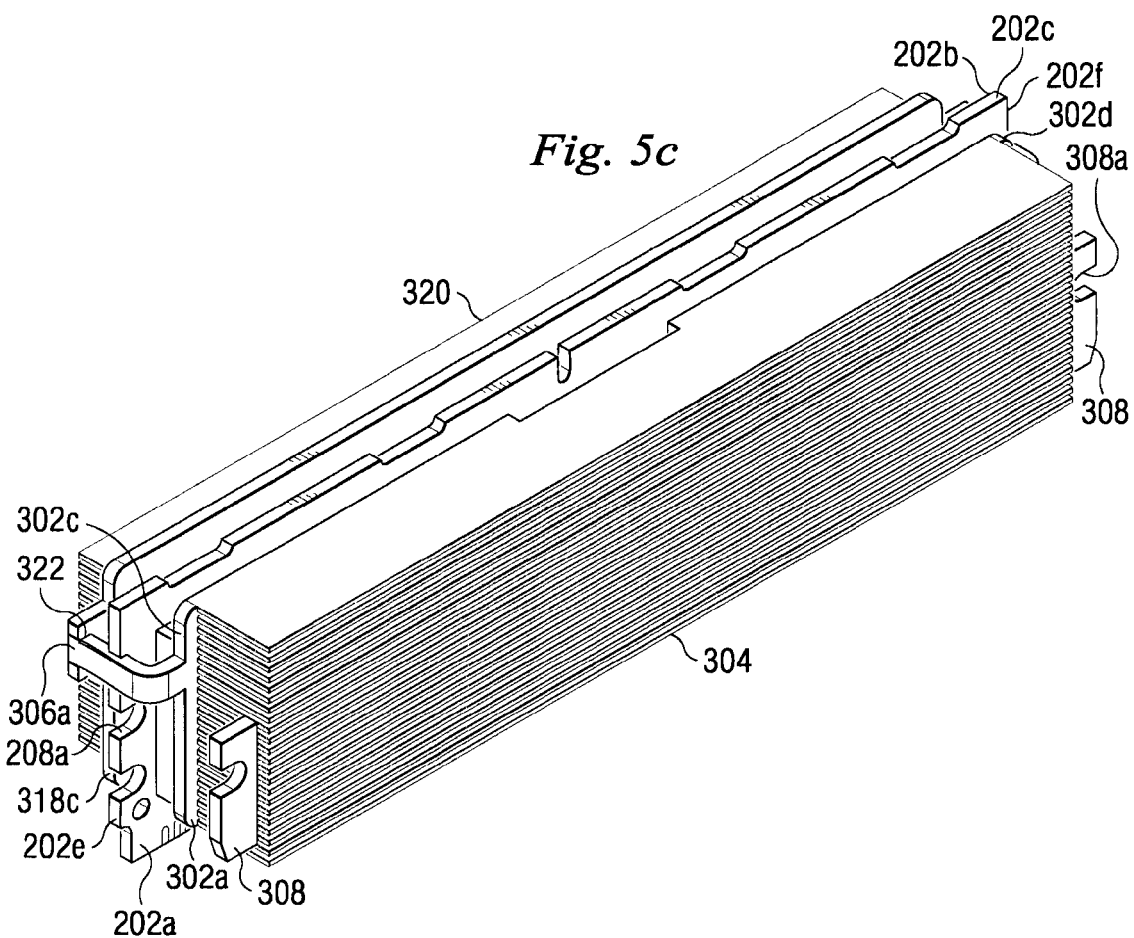
FIG. 5c is a front perspective view illustrating an embodiment of the heat producing component of FIG. 2 and the heat dissipation apparatus of FIGS. 3a, 3b, 3c and 3d coupled together.
Figure 5D:
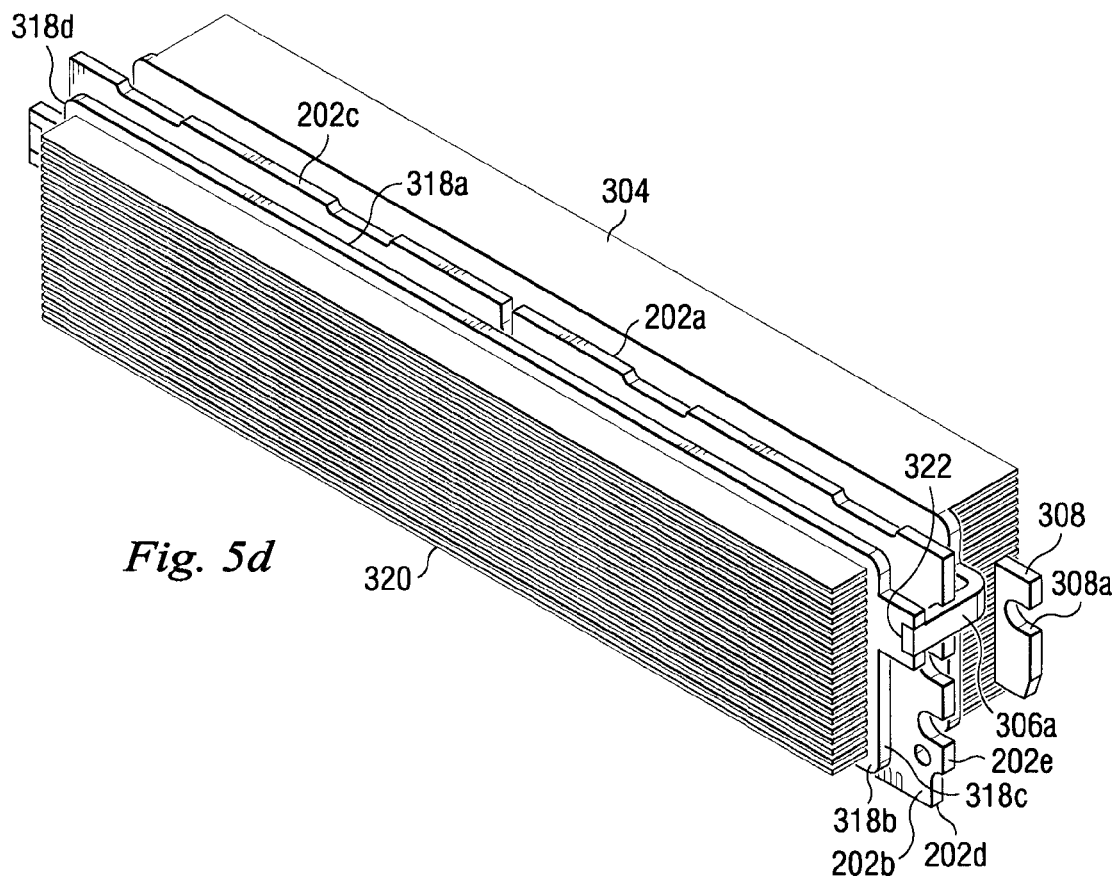
FIG. 5d is a rear perspective view illustrating an embodiment of the heat producing component of FIG. 2 and the heat dissipation apparatus of FIGS. 3a, 3b, 3c and 3d coupled together.

Referring now to FIGS. 2, 3a, 3b, 3c, 3d, 4a, 4b, 5a, 5b, 5c and 5d, a method 500 for dissipating heat from a heat producing component is illustrated. The method 500 begins at step 502 where adjacent component connectors defining component slots are provided. The IHS 400, described above with reference to FIGS. 4a and 4b, is provided including the adjacent connectors 406a, 406b, 406c, 406d, 406e, 406f, 406g and 406h each defining a connector slot 406aa, 406ba, 406ca, 406da, 406ea, 406fa, 406ga and 406ha, respectively. The method 500 then proceeds to step 504 where the heat dissipating apparatus 300 is coupled to the heat producing component 200. The thermal interface materials 310, 312 and 314 are positioned adjacent the heat producing component 200 such that the rear surfaces 310b and 314b of the thermal interface materials 310 and 314, respectively, are adjacent the heat producing members 206 and the rear surface 312b of the thermal interface material 312 is adjacent the heat transfer die 204a on the heat producing member 204, as illustrated in FIG. 5b. The thermal interface material 316 is positioned adjacent the heat producing component 200 such that the front surface 316a of the thermal interface material 316 is located adjacent the rear surface 202b of the heat producing component 200, as illustrated in FIG. 5b. The second heat transfer base 318 is positioned adjacent the thermal interface material 316 such that the front surface 318a of the second heat transfer base 318 is located adjacent the rear surface 316b of the thermal interface material 316, as illustrated in FIG. 5b. The first heat transfer base 302 is positioned adjacent the thermal interface materials 310, 312 and 314 such that the rear surface 302b of the first transfer base 302 is positioned adjacent the front surfaces 310a, 312a and 314a of the thermal interface materials 310, 312 and 314, respectively, with the second base coupling arm 306a adjacent the side edge 302c and the second base coupling arm 306b adjacent the side edge 302d substantially aligned with the first base coupling channels 322 defined by the second heat transfer base 318, as illustrated in FIG. 5b. The first heat transfer base 302, the second heat transfer base 318, the thermal interface materials 310, 312 and 314, and the thermal interface material 316 are all moved towards the heat producing component 200 such that the second base coupling arm 306a on the side edge 302c and the second base coupling arm 306b on the side edge 302d engage the first base coupling channels 322 defined by the second heat transfer base 318 and couple the first heat transfer base 302 and the second heat transfer base 318 to the heat producing component 200, as illustrated in FIGS. 5c and 5d, with the thermal interface materials 310, 312 and 314 located between the heat producing component 200 and the first heat transfer base 302 and the thermal interface material 316 located between the heat producing component 200 and the second heat transfer base 318. While the heat dissipation apparatus 300 has been shown having been coupled to the heat producing component 200, in an embodiment, the heat dissipation apparatus 300 may be fabricated as part of the heat producing component 200. Furthermore, the thermal interface materials 310, 312, 314 and 316 have been described as solid or semi-solid materials, but may also include, for example, gels and/or other thermal interface materials known in the art.

Figure 5E:
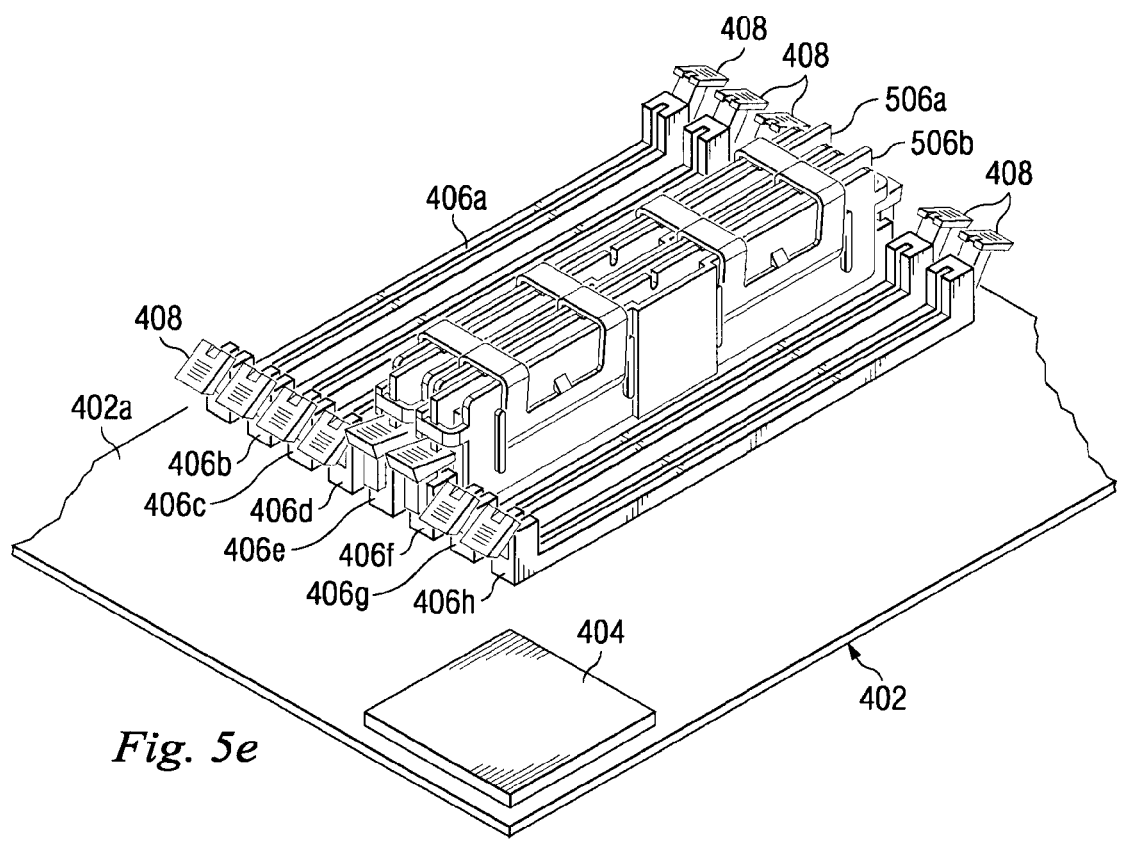
FIG. 5e is a perspective view illustrating an embodiment of the connectors of FIGS. 4a and 4b including a plurality of memory devices.
Figure 5F:
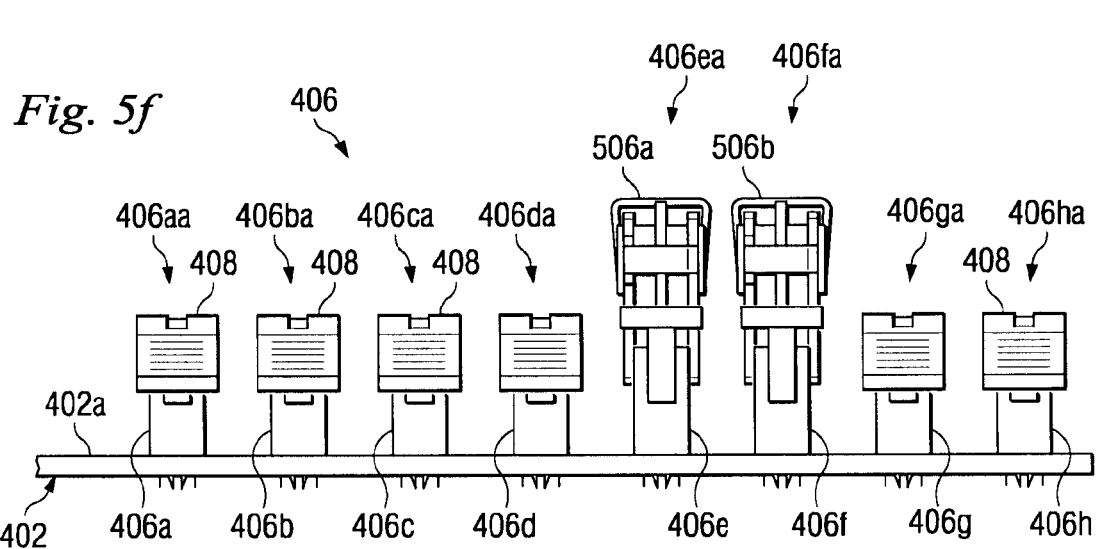
FIG. 5f is a side view illustrating an embodiment of the connectors and memory devices of FIG. 5e.
Figure 5G:
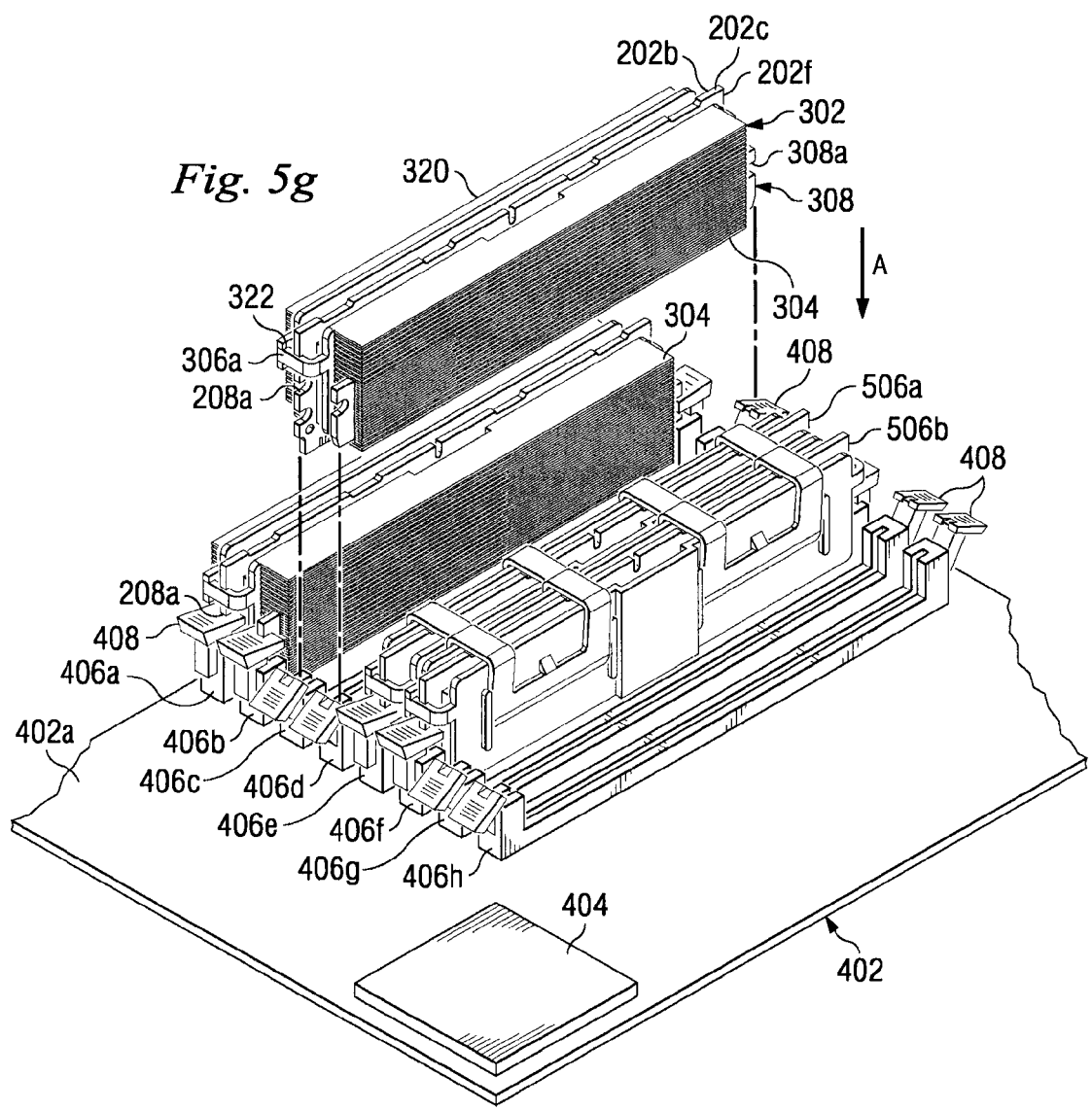
FIG. 5g is a perspective view illustrating an embodiment of the heat producing component and heat dissipation apparatus of FIG. 5c being coupled to the connectors of FIG. 5e.
Figure 5H:
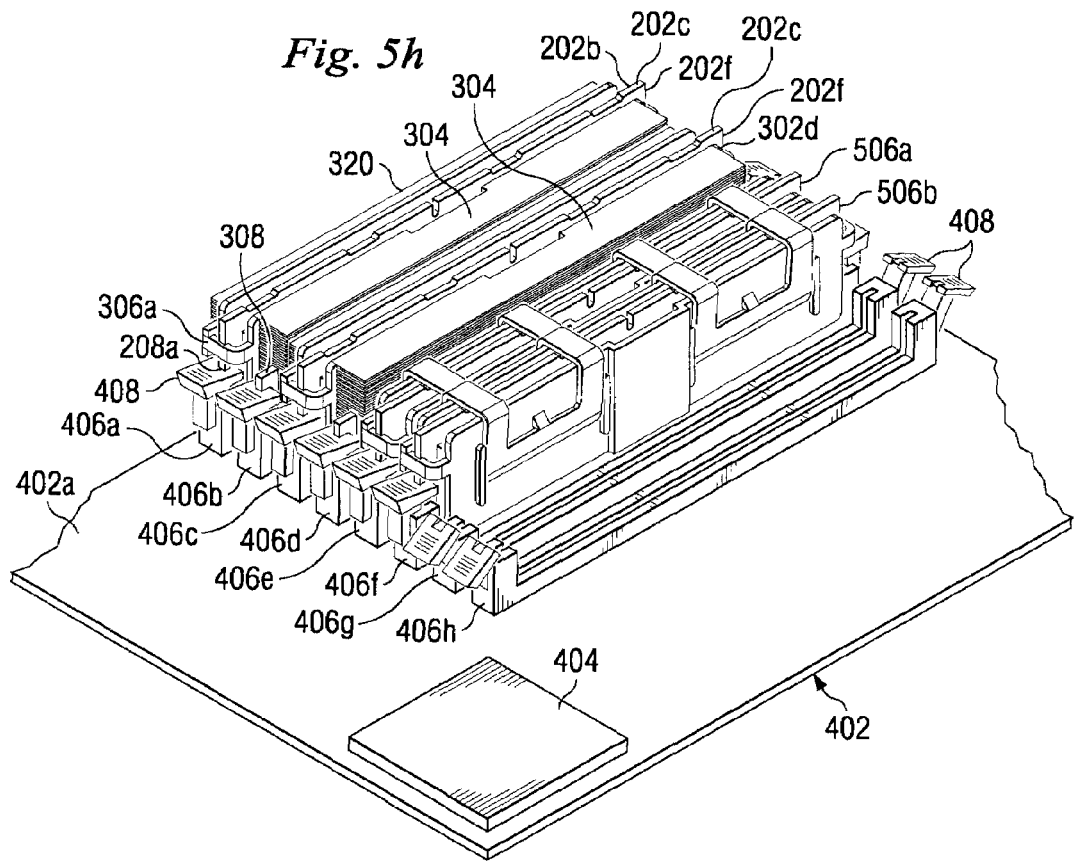
FIG. 5h is a perspective view illustrating an embodiment of the heat producing component and heat dissipation apparatus of FIG. 5c coupled to the connectors of FIG. 5e.
Figure 5I:
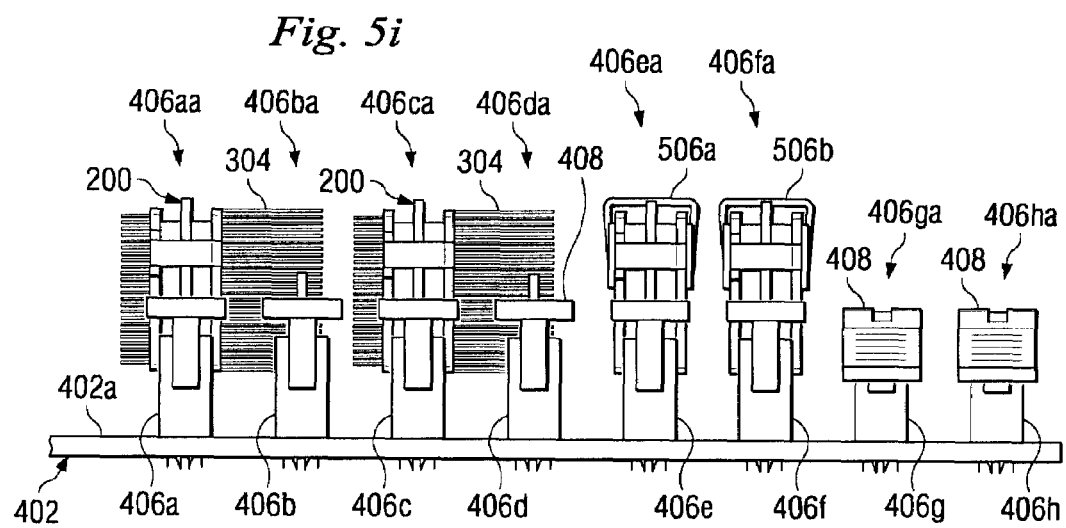
FIG. 5i is a side view illustrating an embodiment of the heat producing component and heat dissipation apparatus of FIG. 5c coupled to the connectors of FIG. 5e.

Referring now to FIGS. 2, 3a, 3b, 3c, 3d, 4a, 4b, 5a, 5c, 5e, 5f, 5g, 5h and 5i, the method 500 then proceeds to step 506 where the heat producing component 200 is coupled to a connector. In an embodiment, a plurality of memory devices 506a and 506b may already be coupled to the connectors 406e and 406f and located in the component slots 406ea and 406fa, as illustrated In FIGS. 5e and 5f. The heat producing component 200 including the heat dissipating apparatus 300 is then positioned adjacent the connectors 406c and 406d such that the side edges 202e and 202f on the heat producing component 200 are located adjacent the securing members 408 on each end of the connector 406c and the second connector coupling members 308 on the heat dissipation member 304 are located adjacent the securing members 408 on each end of the connector 406d, as illustrated in FIG. 5g. The heat producing component 200 and the heat dissipation apparatus 300 are then moved in a direction A such that the bottom edge 202d of the heat producing component 200 engages the connector 406c, the securing members 408 on each end of the connector 406c rotate into engagement with the connector coupling channels 208a defined adjacent the side edges 202e and 202f of the heat producing component 200, and the securing members 408 on each end of the connector 406d rotate into engagement with the connector coupling channel 308a defined by each second connector coupling member 308 on the heat dissipation member 304, as illustrated in FIGS. 5h and 5i, coupling the heat producing component 200 and the heat dissipation member 300 to the connectors 406c and 406d. With the heat producing component 200 and the heat dissipation member 300 coupled to the connectors 406c and 406d, the heat producing component 200 is located in the component slot 406ca defined by the connector 406c and the heat dissipation member 304 is located in the component slot 406da defined by the connector 406d, with the heat dissipation member 304 supported by the connector 406d, as illustrated in FIG. 5i. In an embodiment, a heat producing component 200 with a heat dissipation apparatus 300 may be coupled to the connectors 406a and 406b with the heat producing component 200 located in the component slot 406aa defined by the connector 406a and the heat dissipation member 304 located in the component slot 406ba defined by the connector 406b in substantially the same manner as described above, as illustrated in FIGS. 5h and 5i. The method 500 then proceeds to step 508 where heat is dissipated from the heat producing component 200 using the heat dissipating member 304. An airflow is created using methods known in the art such that air moves past the heat dissipating member 304 and dissipated heats from the heat producing component 200. In an embodiment, any two adjacent connectors that are empty may be used to couple a heat producing component 200 with a heat dissipation apparatus 300, thus providing a method and apparatus for dissipating heat from a heat producing component by utilizing an empty adjacent component slot in order to increase cooling of the heat producing component and increase airflow efficiency in the entire system.

Figure 6:
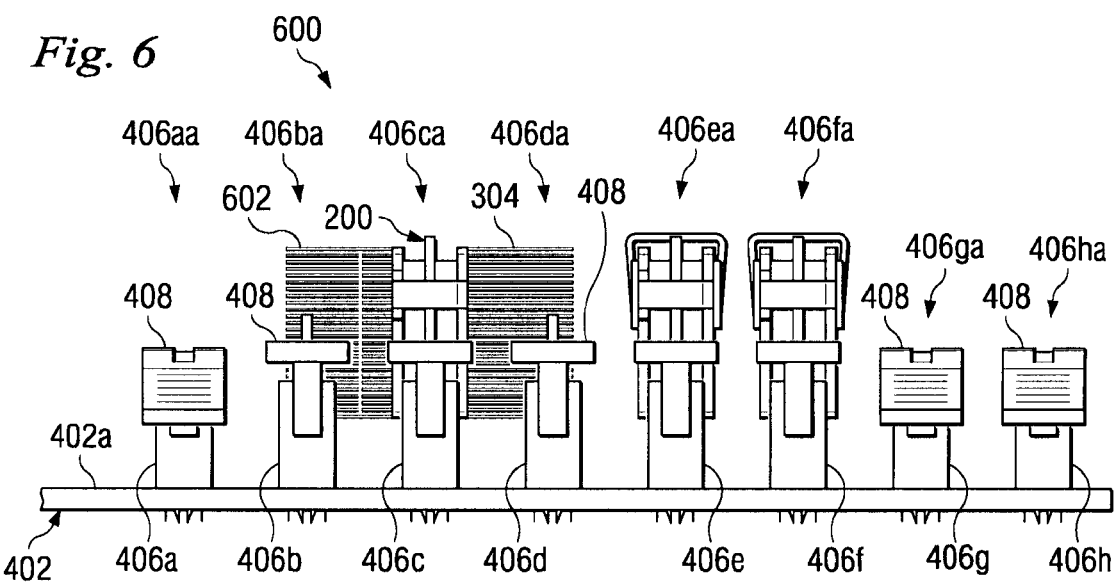
FIG. 6 is a perspective view illustrating an alternative embodiment of the heat producing component and an alternative heat dissipation apparatus coupled to the connectors of FIG. 5e.

Referring now to FIG. 6, in an alternative embodiment, a heat dissipation apparatus 600 is substantially the same in design and operation as the heat dissipation apparatus 200, described above with reference to FIGS. 2, 3a, 3b, 3c, 3d, 4a, 4b, 5a, 5b, 5c, 5d, 5e, 5f, 5g, 5h and 5i, with the provision of a second heat dissipation member 602 extending from the second heat transfer base 318 that is substantially similar to the first heat transfer base 302 and including third connector coupling member on each of its ends that is substantially similar to the second connector coupling member 308 on the heat dissipation member 304. When the heat producing component 200 is coupled to the connector 406c and located in the component slot 406ca, the first heat dissipation member 304 extends into the component slot 406da and is supoorted by the connector 406d and the second heat dissipation member 602 extends into the component slot 406ba and is supported by the connector 406b, as illustrated in FIG. 6. Thus, a method and apparatus for dissipating heat from a heat producing component is provided that utilizes two empty and adjacent component slots in order to increase cooling of the heat producing component and increase airflow efficiency in the entire system.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A heat dissipation apparatus, comprising:
    a board;
    a first component connector mounted to the board and defining a first component slot located immediately adjacent the first component connector and opposite the first component connector from the board;
    a second component connector mounted to the board and defining a second component slot located immediately adjacent the second component connector and opposite the second component connector from the board, whereby the second component connector is located adjacent to the first component connector;
    a heat producing component coupled to the first component connector and located in the first component slot; and
    a first heat dissipating member thermally coupled to the heat producing component and comprising a plurality of fins, wherein the plurality of fins on the first heat dissipating member extend into the second component slot.

2. The apparatus of claim 1, wherein the first heat dissipating member comprises a second connector coupling member that is operable as a means to securingly engage the second component connector when the heat producing component is coupled to the first component connector.

3. The apparatus of claim 1, wherein the first heat dissipating member comprises a first heat transfer base that is coupled to a memory device heat producing component.

4. The apparatus of claim 3, further comprising:
    a second heat transfer base, wherein the first heat transfer base is operable as a means to engage a first side of the heat producing component and the second heat transfer base is operable as a means to couple to the first heat transfer base and engage a second side of the heat producing component.

5. The apparatus of claim 4, wherein the plurality of fins on the first heat dissipating member extend from the first heat transfer base and a plurality of fins on the second heat dissipating member extend from the second heat transfer base such that the plurality of fins on the first heat dissipating member are located in the second component slot that is defined by the second component connector and the plurality of fins on the second heat dissipating member are located in a third component slot that is defined by a third component connector that is located adjacent the first component connector when the heat producing component is coupled to the first component connector and located in the first component slot.

6. The apparatus of claim 1, wherein the heat producing component is a memory device.

7. The apparatus of claim 6, wherein the heat producing component is a Fully Buffered Dual Inline Memory Module (FBDIMM).

8. An information handling system, comprising:
    a board,
    a processor mounted to the board;
    a first component connector located on the board and defining a first component slot located immediately adjacent the first component connector and opposite the first component connector from the board, whereby the first component connector is electrically coupled to the processor;
    a second component connector located on the board and defining a second component slot located immediately adjacent the second component connector and opposite the second component connector from the board, whereby the second component connector is electrically coupled to the processor and located adjacent to the first component connector;
    a heat producing component coupled to the first component connector and located in the first component slot; and
    a first heat dissipating member thermally coupled to the heat producing component and comprising a second connector coupling member, whereby the first heat dissipating member extends from the heat producing component and into the second component slot and the second connector coupling member is securingly engaged with the second component connector.

9. The system of claim 8, wherein the first heat dissipating member comprises a plurality of fins that extend into the second component slot.

10. The system of claim 8, wherein the heat producing component is a memory device heat producing component.

11. The system of claim 10, wherein the memory device heat producing component is a Fully Buffered Dual Inline Memory Module (FBDIMM).

12. The system of claim 8, further comprising:
    a third component connector located on the board and defining a third component slot located immediately adjacent the third component connector and opposite the third component connector from the board, whereby the third component connector is electrically coupled to the processor and located adjacent to the first component connector and opposite the first component connector from the second component connector.

13. The system of claim 12, further comprising:
    a second heat dissipating member thermally coupled to the heat producing component, whereby the second heat dissipating member extends from the heat producing component and into the third component slot.

14. The system of claim 13, further comprising:
    a third connector coupling member extending from the second heat dissipating member and securingly engaged with the third component connector.

15. The system of claim 8, further comprising:
    a first heat transfer base and a second heat transfer base, wherein the first heat dissipation member extends from the first heat transfer base, and wherein the first heat transfer base engages a first side of the heat producing component and the second heat transfer base is coupled to the first heat transfer base and engages a second side of the heat producing component.

16. The system of claim 8, wherein the first component connector and the second component connector are both memory device connectors.

17. The system of claim 16, wherein the memory device connectors are Dual Inline Memory Module (DIMM) connectors.

18. A method for dissipating heat from a heat producing component, comprising:

providing a board with a first component connector mounted to the board and a second component connector mounted to the board adjacent the first component connector, wherein the first component connector defines a first component slot located immediately adjacent the first component connector and opposite the first component connector from the board, and the second component connector defines a second component slot located immediately adjacent the second component connector and opposite the second component connector from the board;

coupling a heat producing component to the first component connector such that the heat producing component is located in the first component slot, whereby a heat dissipating member extends from the heat producing component such that the heat dissipating member is located in the second component slot;

securingly engaging the heat dissipating member with the second component connector; and dissipating heat from the heat producing component with the heat dissipating member.

19. The method of claim 18, further comprising:

coupling the heat dissipating member to the heat producing component.

20. The method of claim 18, wherein the securingly engaging the heat dissipating member with the second component connector comprises securingly engaging a second connector coupling member that extends from the heat dissipating member with a securing member on the second component connector.

\* \* \* \* \*

UNITED STATES PATENT AND TRADEMARK OFFICE
CERTIFICATE OF CORRECTION

PATENT NO. : 7,480,147 B2  
APPLICATION NO. : 11/549453  
DATED : January 20, 2009  
INVENTOR(S) : Shawn P. Hoss et al.

It is certified that error appears in the above-identified patent and that said Letters Patent is hereby corrected as shown below:

On the Title Page, Item (57)  
Abstract; Line 1; delete "commponent" and insert --component--.

Signed and Sealed this

Second Day of June, 2009

JOHN DOLL  
*Acting Director of the United States Patent and Trademark Office*